(12) United States Patent
Skulason et al.

(10) Patent No.: US 9,746,776 B2
(45) Date of Patent: Aug. 29, 2017

(54) LOW SURFACE ENERGY PHOTORESIST COMPOSITION AND PROCESS

(71) Applicant: E I DU PONT DE NEMOURS AND COMPANY, Wilmington, DE (US)

(72) Inventors: Hjalti Skulason, Buellton, CA (US); Raia Finc, Shoreview, MN (US); Ines Wyrsta, Santa Barbara, CA (US); Smita Dayal, Los Angeles, CA (US); Steven Donald Dascomb, Oxnard, CA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/950,769

(22) Filed: Nov. 24, 2015

(65) Prior Publication Data
US 2016/0149136 A1 May 26, 2016

Related U.S. Application Data

(60) Provisional application No. 62/084,214, filed on Nov. 25, 2014.

(51) Int. Cl.
| | | |
|---|---|---|
| *G03F 7/004* | (2006.01) | |
| *G03F 7/038* | (2006.01) | |
| *G03F 7/16* | (2006.01) | |
| *G03F 7/40* | (2006.01) | |
| *H01L 27/32* | (2006.01) | |

(52) U.S. Cl.
CPC .............. *G03F 7/40* (2013.01); *G03F 7/0046* (2013.01); *G03F 7/0387* (2013.01); *G03F 7/16* (2013.01); *G03F 7/168* (2013.01); *H01L 27/3246* (2013.01)

(58) Field of Classification Search
None
See application file for complete search history.

(56) References Cited

U.S. PATENT DOCUMENTS

| | | | |
|---|---|---|---|
| 4,433,082 A | 2/1984 | Grot | |
| 4,959,283 A * | 9/1990 | Smothers | ................ G03F 7/001 359/28 |
| 6,150,426 A | 11/2000 | Curtin et al. | |
| 6,670,645 B2 | 12/2003 | Grushin et al. | |
| 7,455,793 B2 * | 11/2008 | Hsu | ......................... B82Y 10/00 252/500 |

(Continued)

FOREIGN PATENT DOCUMENTS

| | | |
|---|---|---|
| WO | 03/006537 A1 | 1/2003 |
| WO | 03/008424 A1 | 1/2003 |

(Continued)

OTHER PUBLICATIONS

Chang et al., "Development of an ion sensitive field effect transistor based urea biosensor with solid state reference systems", Sensors, vol. 10 pp. 6115-6127 (Jun. 2010).*

(Continued)

*Primary Examiner* — Martin Angebranndt

(57) ABSTRACT

A fluoropolymer-photoresist composition containing fluorinated polymer for containment of liquid inks in the printing of electronic devices. Methods of applying and treating the fluoropolymer-photoresist composition containing fluorinated polymer to provide low surface energy before and after processing and development of the photoresist.

3 Claims, 6 Drawing Sheets

(56) References Cited

U.S. PATENT DOCUMENTS

| | | | |
|---|---|---|---|
| 7,700,008 B2* | 4/2010 | Hsu | B82Y 20/00 252/519.33 |
| 7,776,506 B2* | 8/2010 | Wang | G03F 7/0392 430/270.1 |
| 2004/0002017 A1* | 1/2004 | Adams | G03F 7/0392 430/270.1 |
| 2006/0057468 A1* | 3/2006 | Igawa | G03F 7/2024 430/5 |
| 2006/0141389 A1* | 6/2006 | Okui | G03F 7/0397 430/270.1 |
| 2009/0231521 A1* | 9/2009 | Kashiwagi | G02B 5/201 349/106 |
| 2010/0220268 A1* | 9/2010 | Ohtani | C09D 11/322 349/106 |
| 2011/0086310 A1* | 4/2011 | Yukawa | G03F 7/0233 430/270.1 |
| 2012/0028167 A1* | 2/2012 | Wang | C08G 73/1042 429/494 |

FOREIGN PATENT DOCUMENTS

| | | |
|---|---|---|
| WO | 03/040257 A1 | 5/2003 |
| WO | 03/063555 A1 | 7/2003 |
| WO | 03/091688 A2 | 11/2003 |
| WO | 2004/016710 A1 | 2/2004 |
| WO | 2007/145979 A2 | 12/2007 |

OTHER PUBLICATIONS

Wilkie et al., "Interaction of poly(methyl methacrylate) and Nafions", J. Appl. Poyl. Sci. vol. 42 pp. 901-909 (1991).*

Sigma-Aldrich specification sheet for Nafion prefluorinated resins, 5 wt%.*

W.S. Deforest, Photoresist: Materials and Processes, Mcgraw Hill, 1975—Book Not Included.

A. Reiser, Photoreactive Polymers: The Sciene and Technology of Resists, John Wiley & Sons, 1989—Book Not Included.

* cited by examiner

LOW SURFACE ENERGY PHOTORESIST COMPOSITION AND PROCESS

RELATED APPLICATION DATA

This application claims priority under 35 U.S.C. §119(e) from U.S. Provisional Application No. 62/084,214 filed on Nov. 25, 2014, which is incorporated by reference herein in its entirety.

BACKGROUND OF THE INVENTION

Field of the Invention

This invention relates to a process and composition for liquid deposition on a surface. In particular, compositions containing non-fluorinated photoresist polymers combined with fluorinated polymers to define containment areas for subsequent liquid printing on the surface. More particularly, a fluoropolymer-photoresist composition on a substrate surface for physical and chemical containment of organic inks deposited using liquid printing techniques. The developed fluoropolymer-photoresist defining non-wetting structures to repel organic inks away from structures and into pixel areas on the substrate. The pixel areas can contain one or more electrodes to produce electrical devices. This composition and process mitigates spreading variability of deposited ink, using both physical and chemical containment to drive ink into desired areas and away from other areas.

Description of the Related Art

An electronic device can include a liquid crystal display ("LCD"), an organic light-emitting diode (OLED) display, or the like. The manufacture of electronic devices may be performed using solution deposition techniques. One process of making electronic devices is to deposit organic layers over a substrate, also referred to as a backplane when containing electronic elements, by printing (e.g., ink-jet printing, continuous printing, etc.). In a printing process, the liquid composition, also called ink, being printed includes an organic material in a solution, dispersion, emulsion, or suspension with an organic solvent, with an aqueous solvent, or with a combination of solvents. After printing, the solvent(s) is (are) evaporated and the organic material remains to form an organic layer for the electronic device.

Devices utilizing one or more layers of organic semiconductor materials laminated with other supporting layers and sandwiched by two electrodes are used in many different kinds of electronic equipment.

Several methods for providing ink containment for OLED devices are described in the literature. These are based on containment structures, also referred to as physical containment, and surface energy discontinuities, also referred to as chemical containment, and combinations of both physical and chemical containment. Among the methods used to supply a combination of physical and chemical containment are surface treatments of the containment structures, for example with plasma fluorination using $CF_4$ or addition of fluorinated surfactant to photoresist formulations, to lower the surface energy of the containment structure. In both instances, $CF_4$ and fluorinated surfactant, the lowering of surface energy is ephemeral and does not survive additional processing of the substrate to produce an OLED device, such as plasma cleaning or ozone treatment. In addition, both $CF_4$ treatment and the use of fluorinated surfactants leads to mobile fluorinated molecules on the bank surface that can enter the OLED device to negatively affect its operation. The $CF_4$ treatment also has the disadvantage of requiring a costly extra step in manufacturing.

Another method is to use fluorinated photopolymer. Fluorinated polymers typically have low solubility in non-fluorinated solvents and as such require fluorinated solvents for processing, both as a solvent for deposition and for the developer. Besides having potential for bioaccumulation, fluorinated solvents are expensive and recycling of material is problematic.

All of these approaches suffer from drawbacks limiting the effectiveness and economics when used in the production of electronic devices. In view of the foregoing it is believed additional improvement is required to optimize containment of inks in organic electronic devices.

SUMMARY OF THE INVENTION

The presently claimed invention is directed to a composition and process to overcome limitations inherent to printing of electronic devices. The composition and process includes, for example, a substrate, a photoresist composition containing a fluorinated polymer, and development of the resulting fluoropolymer-photoresist composition to define pixel areas and non-pixel areas.

The composition and process contains at least the following elements. A composition comprising:
  a photopolymer material having a first contact angle; and
  a fluorinated polymer having a second contact angle;
    wherein the composition has a third contact angle closer to the second contact angle than the first contact.

In one embodiment the fluorinated polymer is present in a range from 0.01% to 60% of the composition.

In one embodiment the fluorinated polymer is present in a range from 0.1% to 50% of the composition.

In one embodiment the fluorinated polymer is present in a range from 1% to 40% of the composition.

In one embodiment the fluorinated polymer is present in a range from 1% to 30% of the composition.

In one embodiment the fluorinated polymer is present in a range from 5% to 25% of the composition.

The fluorinated polymer can be selected from: fluorinated acid polymers, or salts of fluorinated acid polymers, or combinations thereof.

A liquid composition comprising:
  a photopolymer material;
  a fluorinated polymer; and
  an organic liquid; wherein the weight amount of the photopolymer material is greater than 40% of all polymeric material in the composition.

In one embodiment the organic liquid is selected from: alcohols, or ethers, or ketones, or lactones, or alcohol-ethers, or acetates, or aldehydes, or esters, or amides, or combinations thereof.

In one embodiment the fluorinated polymer is a fluorinated acid polymer. In one embodiment the fluorinated acid polymer forms a stable colloidal dispersion in the organic liquid. In one embodiment the fluorinated acid polymer is obtained by a rapid drying process from a water or water-alcohol dispersion, followed by re-dispersion in the organic liquid. In one embodiment the rapid drying process is a freeze drying process.

A process comprising:
  providing a photopolymer material in a first organic liquid to form a first mixture;
  providing a fluorinated polymer in a second organic liquid that optionally is the same as the first organic liquid, to form a colloidal dispersion;
  blending the first mixture and the colloidal dispersion to form a liquid fluoropolymer-photoresist;

depositing the liquid fluoropolymer-photoresist on a surface; and applying heat to remove first and second organic liquids.

exposing fluoropolymer-photoresist to the appropriate wavelength light using a shadowmask to define developing and non-developing areas;

developing the fluoropolymer-photoresist after applying heat to remove first and second organic liquids.

cleaning the surface using ozone or plasma, wherein cleaning is conducted after developing the fluoropolymer-photoresist.

baking the fluoropolymer-photoresist after cleaning the surface, wherein baking reduces the surface energy of the fluoropolymer-photoresist.

A printing process comprising:

providing a substrate with wetting and non-wetting areas created using a fluoropolymer-photoresist.

depositing ink onto substrate such that the ink is contained on the wetting areas only and repelled from the non-wetting areas of the fluoropolymer-photoresist.

An electronic device made with the combination of the photopolymer material and fluoropolymer material and the process of applying and developing the combination of the photopolymer material and fluoropolymer material and the process of depositing ink for containment on the wetting areas of the device.

BRIEF DESCRIPTION OF THE DRAWINGS

The invention will be more fully understood from the following detailed description, taken in connection with the accompanying drawings, which form a part of this application and in which.

Figure 1:
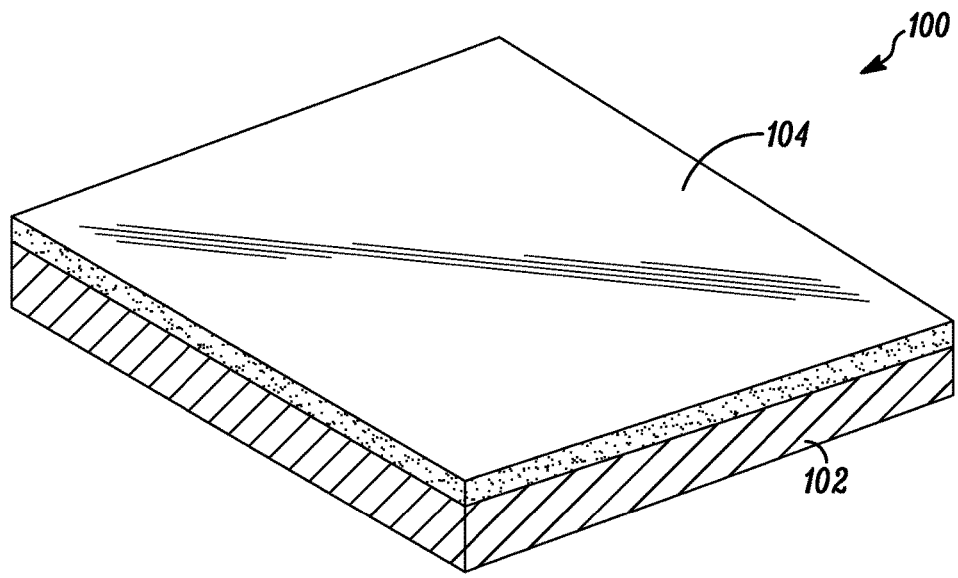
FIG. 1 represents an embodiment of the present invention with a substrate covered with a fluorophotoresist compound.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION OF THE INVENTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims.

Definitions and Clarification of Terms

Before addressing details of embodiments described below, some terms are defined or clarified.

The term "colloidal dispersion" refers to the minute particles suspended in a continuous liquid medium, said particles having a nanometer-scale particle size. The term "colloid-forming" refers to substances that form minute particles when dispersed in a liquid medium, i.e., "colloid-forming" materials are not soluble in the liquid medium.

The term "composition" is used to mean a product of mixing or combining various elements or ingredients.

The term "continuous" and its variants are intended to mean substantially unbroken.

The term "electrode" is used to mean one of the two points through which electricity flows. An anode is a positive electrode and a cathode is a negative electrode.

The term "electroluminescent" or "electroactive" when referring to a layer or material, is intended to mean a layer or material that exhibits electronic or electro-radiative properties. In an electronic device, an electroactive material electronically facilitates the operation of the device. Examples of electroactive materials include, but are not limited to, materials which conduct, inject, transport, or block a charge, where the charge can be either negative (an electron) or positive (a hole), and materials which emit radiation or exhibit a change in concentration of electron-hole pairs when receiving radiation. Examples of inactive materials include, but are not limited to, insulating materials and environmental barrier materials.

The term "electronic device" or sometimes "organic electronic device" is intended to mean a device including one or more organic semiconductor layers or materials.

The term "electron transport" or "electron injection" means, when referring to a layer, material, member or structure, such a layer, material, member or structure that promotes or facilitates migration of negative charges through such a layer, material, member or structure into another layer, material, member or structure.

The term "equivalent weight" or "EW" refers to mass of a substance, in grams, that combines with an equivalent of one gram of hydrogen. Also stated as atomic or molecular weight divided by valence.

The prefix "fluoro" or "fluorinated" indicates that one or more available hydrogen atoms have been replaced with a fluorine atom. The terms "fully-fluorinated" and "perfluorinated" are used interchangeably and refer to a compound where all of the available hydrogens bonded to carbon have been replaced by fluorine. The term "highly-fluorinated" refers to a compound in which at least 90% of the available hydrogens bonded to carbon have been replaced by fluorine. The term "non-fluorinated" refers to a compound in which less than 25% of the available hydrogens bonded to carbon have been replaced by fluorine.

The term "hole injecting" is synonymous with "electron withdrawing." Literally, holes represent a lack of electrons and are typically formed by removing electrons, thereby creating an illusion that positive charge carriers, called holes, are being created or injected. The holes migrate by a shift of electrons, so that an area with a lack of electrons is filled with electrons from an adjacent layer, which give the appearance that the holes are moving to that adjacent area. For simplicity, the terms holes, hole injecting, hole transport, and their variants will be used.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "liquid" is intended to include single liquid materials, combinations of liquid materials, and these may be solutions, dispersions, suspensions, or emulsions.

The term "mixture" is used to describe something made by combining two or more ingredients.

The term "organic liquid" is intended to include single liquid materials, combinations of liquid materials, and these may be solutions, dispersions, suspensions and emulsions, where the class of chemicals has a carbon basis.

The term "photopolymer" refers to a polymer that changes its properties when exposed to light in a region of the electromagnetic spectrum.

The term "polymer" is intended to mean a material having at least one repeating monomeric unit. The term includes homopolymers having only one kind of monomeric unit, and copolymers having two or more different monomeric units.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions. A monochromatic display may include pixels but no subpixels. A sensor array can include pixels that may or may not include subpixels.

The term "rapid drying" refers to a short time interval for removal of liquid from a mixture, solution, dispersion, or suspension.

The term "stable dispersion" refers to a composition where minute particles stay suspended in a continuous liquid medium over substantially long time, at least 6 months.

The term "substrate" is used to describe a surface in which printing liquid is placed after leaving a nozzle assembly.

The term "surface energy" is the energy required to create a unit area of a surface from a material. A characteristic of surface energy is that liquid materials with a given surface energy will not wet surfaces with a sufficiently lower surface energy. One way to determine the relative surface energies, is to compare the contact angle of a given liquid on layers of different materials. As used herein, the term "contact angle" is intended to mean the angle $\Phi$ shown in FIG. 3. For a droplet of liquid medium, angle $\Phi$ is defined by the intersection of the plane of the surface and a line from the outer edge of the droplet to the surface. Furthermore, angle $\Phi$ is measured after the droplet has reached an equilibrium position on the surface after being applied, i.e. "static contact angle". A variety of manufacturers make equipment capable of measuring contact angles.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic cell, and semiconductive member arts.

Description of Composition and Process

Throughout the following detailed description similar reference characters refers to similar elements in all figures of the drawings.

FIG. 1 represents an embodiment of the present invention with a coated substrate 100 having a substrate 102 covered with a fluoropolymer-photoresist composition 104. The fluoropolymer-photoresist composition 104 is the result of the combination of a photoresist (described below) and a fluorinated polymer (described below). The deposition of the fluoropolymer-photoresist composition 104 is not particularly limited, and can encompass any number of deposition methods.

Deposition methods include any number of technologies for control of layer thickness on a substrate. Some of these technologies include self-regulated methods to control thickness, including spin coating, rod coating, dip coating, roll coating, gravure coating or printing, lithographic or flexographic printing, screen coating etc. Other of these technologies seek to control deposition thickness using controlled deposition techniques including ink jet printing, spray coating, nozzle coating, slot die coating, curtain coating, bar or slide coating, etc.

Figure 2:
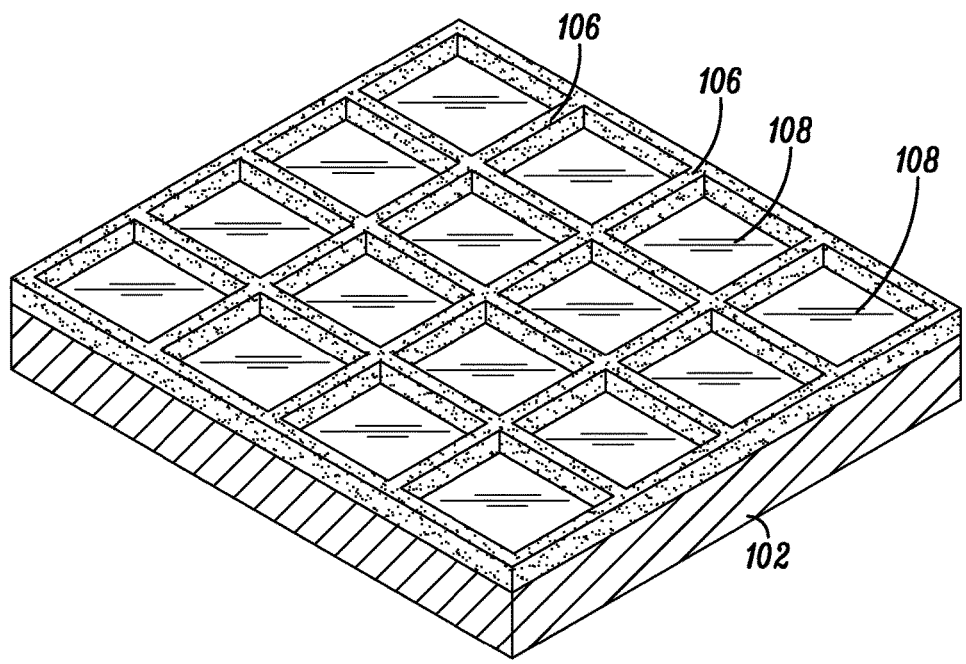
FIG. 2 represents an embodiment of the present invention after development of the fluorophotoresist compound to produce pixel areas and non-pixel areas on the substrate.

FIG. 2 represents the substrate 102 containing pixel areas 108 and non-pixel areas 106. The pixel areas 108 are areas where the fluoropolymer-photoresist composition 104 (not shown) has been removed, while non-pixel areas 106 are the result of exposure to radiation and development of fluoropolymer-photoresist composition 104. Pixel areas 108 define the area for subsequent deposition of electroactive layers to produce electronic devices, for example an OLED device.

Figure 3:
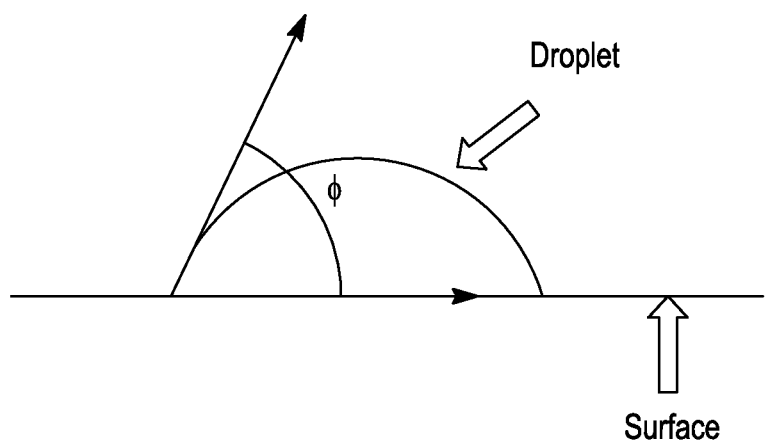
FIG. 3 represents contact angle between a surface and a liquid droplet.

FIG. 3 exhibits a contact angle $\Phi$ used to describe relative surface energies in comparing the contact angle of a given liquid on a layer. For a droplet of liquid medium, angle $\Phi$ is defined by the intersection of the plane of the surface and a line from the outer edge of the droplet to the surface. Furthermore, angle Φ is measured after the droplet has reached an equilibrium position on the surface after being applied, i.e. "static contact angle". A variety of manufacturers make equipment capable of measuring contact angles. For the following figures and examples, contact angle is measured using a Rame-Hart 500 measurement tool.

Figure 4:
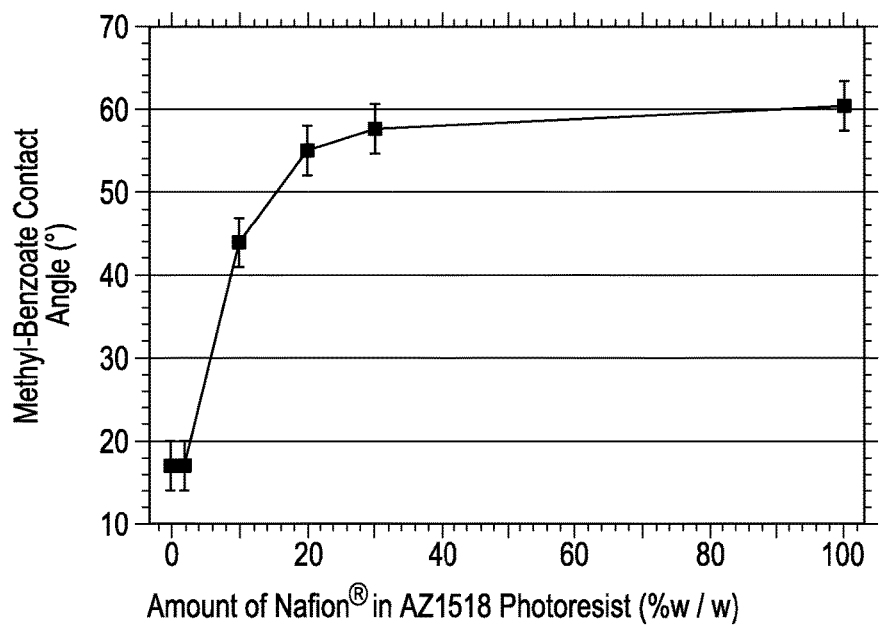
FIG. 4 represents change in organic liquid contact angle for various levels of fluorinated acid polymer in poly(methyl acrylate) photoresist.

FIG. 4 is a graph of organic liquid contact angle vs. fluoropolymer content, relative to total polymer content (fluoropolymer and photopolymer), within the fluoropolymer-photoresist composition after 295° C. bake for 10 minutes. The specific fluoropolymer is DuPont™ Nafion®, a fluorinated acid polymer. The specific photoresist is AZ1518® (Clariant Co. Charlotte, N.C.), a poly(methyl acrylate). The organic liquid is methyl-benzoate. Note the rather dramatic change in contact angle for fluoropolymer content up to approximately 30% (w/w) and slower increases in contact angle above approximately 30%. The 0% point representing a comparative example of photoresist containing no fluoropolymer. The 100% point representing pure Nafion® fluorinated acid polymer. In other words, the 50% point on the graph denotes equal amounts of Nafion® and poly(methyl acrylate) photoresist.

Figure 5:
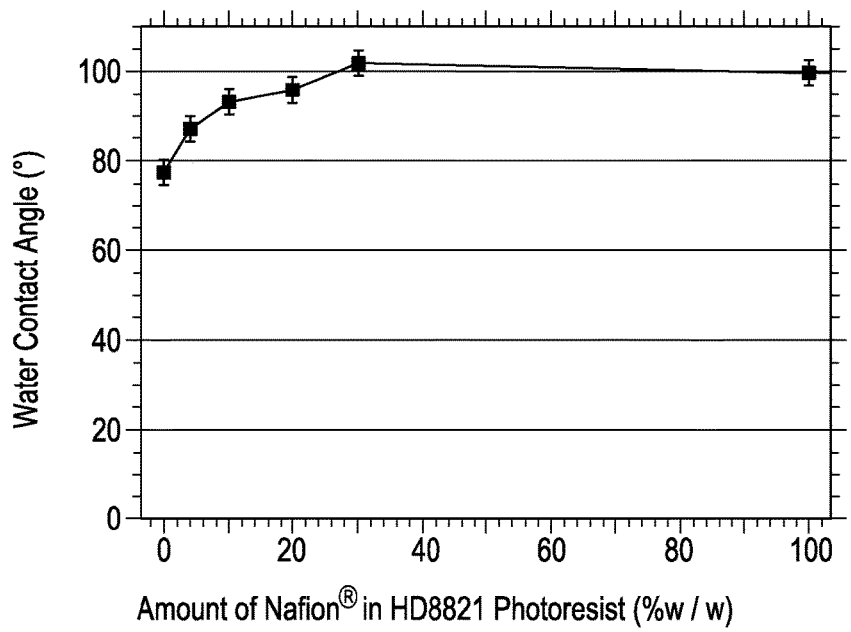
FIG. 5 represents change in water contact angle for various levels of fluorinated acid polymer in polyimide photoresist.

FIG. 5 is a graph of water contact angle vs. fluoropolymer content, relative to total polymer content, within the fluoropolymer-photoresist composition after 295° C. bake for 10 minutes. The specific fluoropolymer is DuPont™ Nafion®, while the specific photoresist is HD8821® (HD MicroSystems, LLC, Parlin, N.J.), a polyimide. Again note the change in contact angle up to approximately 30% (w/w) from a comparative point of 0%.

Figure 6:
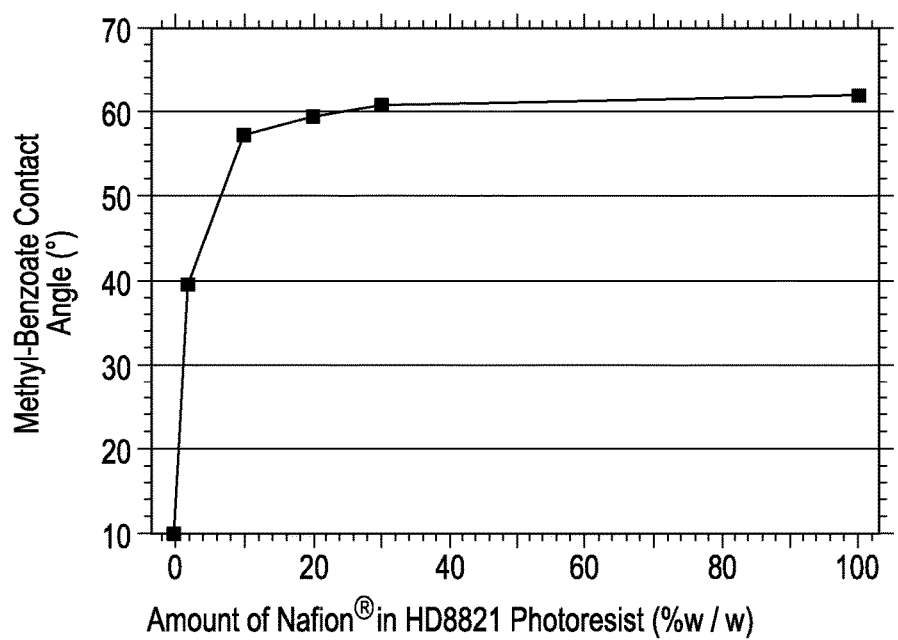
FIG. 6 represents change in organic liquid contact angle for various levels of fluorinated acid polymer in polyimide photoresist, after bake step.

FIG. 6 is a graph of organic liquid contact angle vs. fluoropolymer content, relative to total polymer content, within the fluoropolymer-photoresist composition after 295° C. bake for 10 minutes. The specific fluoropolymer is DuPont™ Nafion®, the specific photoresist is HD8821®, and the organic liquid is methyl-benzoate. The contact angle at 0% fluoropolymer, the comparative example having no fluoropolymer, indicates a completely wetted surface. The dramatic increase in contact angle up to approximately 30% (w/w) is considerably larger than that exhibited by water contact angle of FIG. 5.

Figure 7:
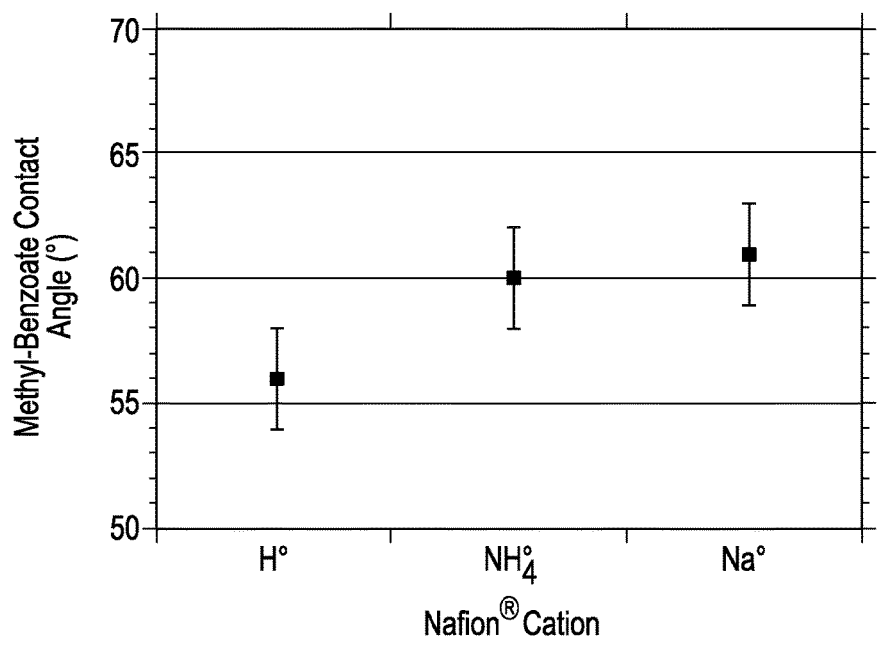
FIG. 7 represents change in organic liquid contact angle for fluorinated acid polymer, and two distinct cations for fluorinated salt polymer, in polyimide photoresist.

FIG. 7 is a graph of organic liquid contact angle vs. different cations for 10% (w/w) fluoropolymer content, relative to total polymer content, within the fluoropolymer-photoresist composition. The specific fluoropolymer is a fluorinated salt of DuPont™ Nafion®, the specific photoresist is HD8821®, and the organic liquid is methyl-benzoate. Note the polymer salt of Nafion® is also effective in combination with the photoresist.

Figure 8:
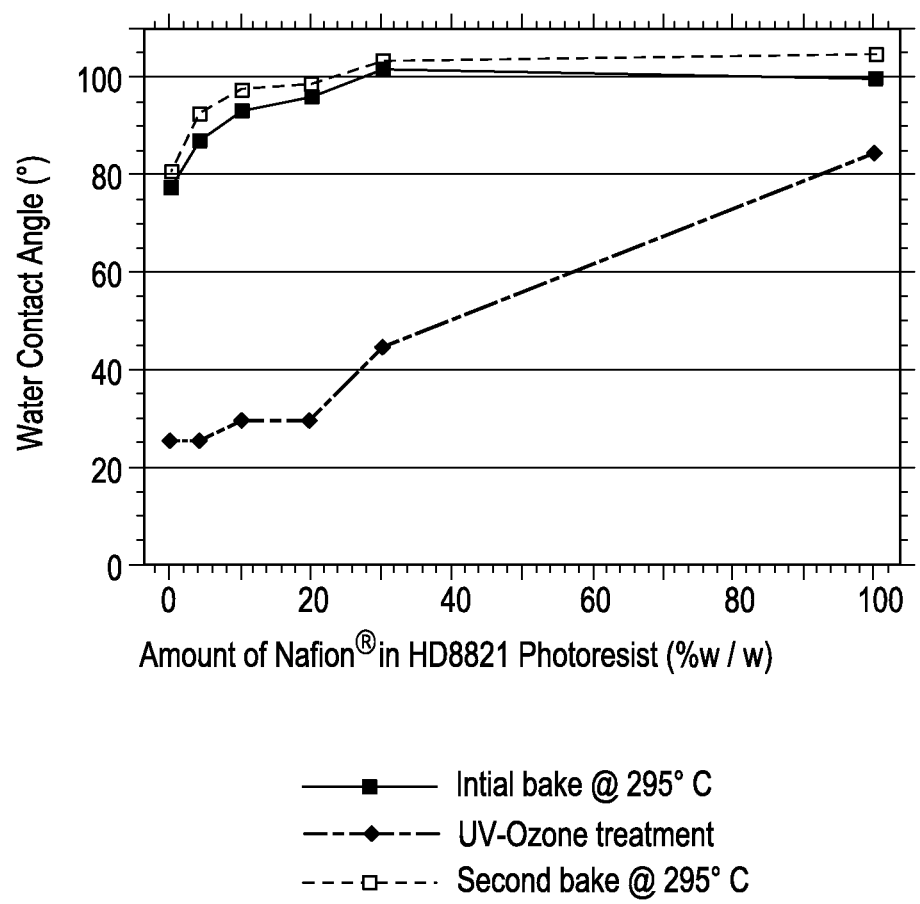
FIG. 8 represents change in water contact angle for various levels of fluorinated acid polymer in polyimide photoresist, measured at three distinct stages of processing.

FIG. 8 is a graph of water contact angle vs. fluoropolymer content, relative to total polymer content, within the fluoropolymer-photoresist composition after different stages in the processing of the fluoropolymer-photoresist composition. The specific fluoropolymer is DuPont™ Nafion®, while the specific photoresist is HD8821®. Note the drop in contact angle, for all fluoropolymer content percentages, from the initial bake at 295° C. for 10 minutes to the UV-Ozone treatment. And recovery of contact angle using a second bake step at 295° C. for 10 minutes.

Figure 9:
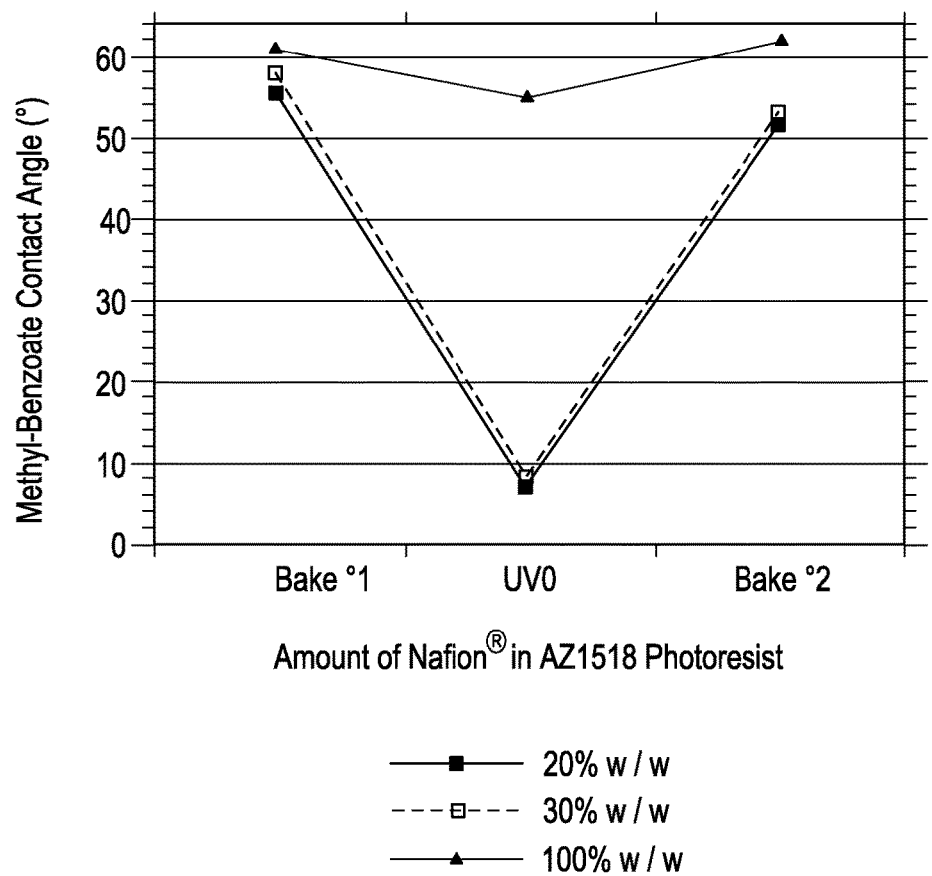
FIG. 9 represents change in organic liquid contact angle for three levels of fluorinated acid polymer in poly(methyl acrylate) photoresist, measured at three distinct stages of processing.

FIG. 9 is a graph of organic liquid contact angle vs. stages of processing of the fluoropolymer-photoresist composition, for two levels of fluoropolymer content in photoresist and pure fluoropolymer (the 100% data point). The specific fluoropolymer is DuPont™ Nafion®, the specific photoresist is AZ1518®, and the organic liquid is methyl-benzoate.

Note the dramatic drop in contact angle incurred as a result of the UV-Ozone treatment, and the recovery of contact angle after the second bake step at 295° C. for 10 minutes.

The presence of a fluorinated polymer as part of the photoresist reduces the surface energy of the resulting structures on the substrate, making it ideal for containment of printing inks to pre-designed locations (i.e. the locations on the substrate where no fluoropolymer-photoresist exist after patterning). Furthermore, the addition of a fluorinated polymer to the photoresist does not affect the photopatterning process of the photoresist. Minor adjustments in exposure and developer steps for fluoropolymer-photoresist produced similar patterns as for pure photoresist.

Description of Photoresist with Fluorinated Polymer

In some embodiments, the photoresist is positive-working, which means that the photoresist layer becomes more removable in the areas exposed to activating radiation. In some embodiments, the positive-working photoresist is a radiation-softenable composition. In this case, when exposed to radiation, the photoresist can become more soluble or dispersable in a liquid medium, more tacky, more soft, more flowable, more liftable, or more absorbable. Other physical properties may also be affected.

In some embodiments, the photoresist is negative-working, which means that the photoresist layer becomes less removable in the areas exposed to activating radiation. In some embodiments, the negative-working photoresist is a radiation-hardenable composition. In this case, when exposed to radiation, the photoresist can become less soluble or dispersable in a liquid medium, less tacky, less soft, less flowable, less liftable, or less absorbable. Other physical properties may also be affected.

Photoresist materials are well known in the art. Examples of references include *Photoresist: Materials and Processes*, by W. S. DeForest (McGraw-Hill, 1975) and *Photoreactive Polymers: The Science and Technology of Resists*, by A. Reiser (John Wiley & Sons, 1989). There are many commercially available photoresists. Examples of types of materials that can be used include, but are not limited to, photocrosslinking materials such as dichromated colloids, polyvinyl cinnamates, and diazo resins; photosolubilizing materials such as quinine diazides; and photopolymerizable materials such as vinyl ethers, epoxies, and acrylate/methacrylates. In some cases, photoreactive polyimide systems can be used.

After the photoresist is deposited and dried to form a layer, with optional baking, it is exposed to activating radiation through a gradient mask. The term "activating radiation" means energy in any form, including heat in any form, the entire electromagnetic spectrum, or subatomic particles, regardless of whether such radiation is in the form of rays, waves, or particles. In some embodiments, the activating radiation is selected from infrared radiation, visible radiation, ultraviolet radiation, and combinations thereof. In some embodiments, the activating radiation is UV radiation. The gradient mask has a pattern in which there are areas that are transparent to the activating radiation, areas that are opaque to the activating radiation, and areas that are partially transparent (semi-transmissive) to activation radiation. In some embodiments, the partially transparent areas have 5-95% transmission; in some embodiments, 10-80% transmission; in some embodiments, 10-60% transmission; in some embodiments, 10-40% transmission; in some embodiments, 10-20% transmission.

In embodiments where a positive-working photoresist is used, the portions of the photoresist layer underneath the transparent areas of the gradient mask will become more easily removed while portions underneath the opaque areas of the mask will not be easily removed. Portions of the photoresist under the partially transparent areas of the mask will be partially removable.

In embodiments where a negative-working photoresist is used, the portions of the photoresist layer underneath the transparent areas of the gradient mask will become less removable while portions underneath the opaque areas of the mask will remain easily removed. Portions of the photoresist under the partially transparent areas of the mask will partially removable.

Exposure times and doses will depend on the composition of the photoresist used, and on the radiation source. Exemplary times and doses are well known in the photoresist art.

After exposure to activating radiation, the photoresist is developed. The term "development" and all its various forms, is intended to mean physical differentiation between areas of the photoresist exposed to radiation and areas not exposed to radiation, hereinafter referred to as "development," can be accomplished by any known technique. Such techniques have been used extensively in the photoresist art. Examples of development techniques include, but are not limited to, treatment with a liquid medium, treatment with an absorbant material, treatment with a tacky material, and the like. In some embodiments, the photoresist is treated with a liquid medium, referred to as a developer or developer solution.

The development step results in a bank structure. The structure has openings, resulting from complete removal of the photoresist, in the pixel areas where organic active material(s) will be deposited. Surrounding each pixel opening is a bank structure. The structure has partially removed photoresist in the areas immediately adjacent to the pixel openings, resulting from exposure through the partially transparent areas of the mask. Further removed from the pixel openings, the structure has photoresist remaining intact.

Mixing, or blending, of the photoresist with the fluorinated polymer results in the presently claimed fluoropolymer-photoresist.

In one embodiment the fluorinated polymer can be a fluorinated acid polymer, or fluorinated acid-salt polymer. The fluorinated acid polymer (hereinafter referred to as "FAP") can be any polymer which is fluorinated and has acidic groups. As used herein, the term "fluorinated" means that at least one hydrogen bonded to a carbon has been replaced with a fluorine. The term includes partially and fully fluorinated materials. In one embodiment, the fluorinated acid polymer is highly fluorinated. The term "highly fluorinated" means that at least 50% of the available hydrogens bonded to a carbon, have been replaced with fluorine. The term "acidic group" refers to a group capable of ionizing to donate a hydrogen ion to a Brønsted base to form a salt. The acidic groups supply an ionizable proton. In one embodiment, the acidic group has a pKa of less than 3. In one embodiment, the acidic group has a pKa of less than 0. In one embodiment, the acidic group has a pKa of less than −5. The acidic group can be attached directly to the polymer backbone, or it can be attached to side chains on the polymer backbone.

Examples of acidic groups include, but are not limited to, carboxylic acid groups, sulfonic acid groups, sulfonamide groups, phosphoric acid groups, phosphonic acid groups, and combinations thereof. The acidic groups can all be the same, or the polymer may have more than one type of acidic group.

In one embodiment, the FAP is water-soluble. In one embodiment, the FAP is dispersible in water. In one embodiment, the FAP forms a colloidal dispersion in water and in polar organic solvents, such as alcohols, or ethers, or ketones, or lactones, or alcohol-ethers, or acetates, or aldehydes, or esters, or amides, or combinations thereof.

In one embodiment, the polymer backbone is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In one embodiment, the polymer backbone is highly fluorinated. In one embodiment, the polymer backbone is fully fluorinated.

In one embodiment, the acidic groups are selected from sulfonic acid groups and sulfonamide groups. In one embodiment, the acidic groups are on a fluorinated side chain. In one embodiment, the fluorinated side chains are selected from alkyl groups, alkoxy groups, amido groups, ether groups, and combinations thereof.

In one embodiment, the non-wettable FAP is a colloid-forming polymeric acid. As used herein, the term "colloid-forming" refers to materials that are insoluble in water and polar organic solvents, and form colloids when dispersed into an aqueous medium or a medium made up of polar organic solvents. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any colloid-forming polymeric material having acidic protons can be used. In one embodiment, the colloid-forming fluorinated polymeric acid has acidic groups selected from carboxylic groups, sulfonic acid groups, and sulfonamide groups. In one embodiment, the colloid-forming fluorinated polymeric acid is a polymeric sulfonic acid. In one embodiment, the colloid-forming polymeric sulfonic acid is perfluorinated. In one embodiment, the colloid-forming polymeric sulfonic acid is a perfluoroalkylenesulfonic acid.

In one embodiment, the non-wettable colloid-forming FAP is a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula $-SO_3E^5$ where $E^5$ is a cation, also known as a "counter-ion". $E^5$ may be H, Li, Na, K or $N(R_1)(R_2)(R_3)(R_4)$, and $R_1$, $R_2$, $R_3$, and $R_4$ are the same or different and are and in one embodiment H, $CH_3$ or $C_2H_5$. In another embodiment, $E^5$ is H, in which case the polymer is said to be in the "acid form". $E^5$ may also be multivalent, as represented by such ions as $Ca^{++}$, and $Al^{+++}$. It is clear to the skilled artisan that in the case of multivalent counter-ions, represented generally as $M^{x+}$, the number of sulfonate functional groups per counter-ion will be equal to the valence "x".

The FSA polymers can be prepared as colloidal aqueous dispersions. They may also be in the form of dispersions in other media, examples of which include, but are not limited to, alcohol, ethers, such as tetrahydrofuran, ketones, lactones, esters, alcohol-ether, acetates, aldehydes, amides, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid composition can be adjusted by methods known in the art.

Aqueous dispersions of FSA polymer are available commercially as Nafion® dispersions, from E. I. du Pont de Nemours and Company (Wilmington, Del.).

The liquid ink, to produce organic layers, is chosen to have a surface energy that is greater than the surface energy of the fluorophotoresist composition, but approximately the same as or less than the surface energy of the untreated substrate. Thus, the liquid ink will wet the pixel areas, but will be repelled from the non-pixel containment areas of the substrate.

Description of Electronic Device

Devices for which the composition and process described herein can be used include organic electronic devices. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In such devices, an organic active layer is sandwiched between two electrical contact layers. In many cases, at least one of the electrical contact layers is light-transmitting so that light can pass through the electrical contact layer. The organic active layer emits light through the light-transmitting electrical contact layer upon application of electricity across the electrical contact layers. Additional electroactive layers may be present between the light-emitting layer and the electrical contact layer(s).

It is well known to use organic electroluminescent compounds as the active component in such devices to provide the necessary colors. The printing method described herein is suitable for the printing of liquid compositions containing electroluminescent materials having different colors. Such materials include, but are not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly (spirobifluorenes), polythiophenes, poly(p-phenylenes), copolymers thereof, and mixtures thereof.

To form the printing inks, the above materials are dissolved or dispersed in a suitable liquid composition. A suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, comprising the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), keytones (cyclopentatone) and mixtures thereof. Suitable solvents for photoactive materials have been described in, for example, published PCT application WO 2007/145979.

The OLED device has a first electrical contact layer, which is an anode layer, and a second electrical contact layer, which is a cathode layer. A photoactive layer is between them. Additional layers may optionally be present. Adjacent to the anode may be a buffer layer. Adjacent to the buffer layer may be a hole transport layer, comprising hole transport material. Adjacent to the cathode may be an electron transport layer, comprising an electron transport material. As an option, devices may use one or more additional hole injection or hole transport layers next to the anode and/or one or more additional electron injection or electron transport layers next to the cathode.

Those skilled in the art, having the benefit of the teachings of the present invention, may impart modifications thereto. Such modifications are to be construed as lying within the scope of the present invention, as defined by the appended claims.

EXAMPLES

Example 1

This example illustrates the preparation of a water-free dispersion of Nafion® in γ-Valerolactone.

Freeze-dried Nafion® (3.02 g, 1050 EW) was mixed with 10.02 g of γ-Valerolactone (99%, Sigma-Aldrich Corp., St. Louis, Mo., USA) resulting in 23% solids Nafion® dispersion. The mixture was stirred for 24 hours and then filtered through 0.45 µm DP syringe filter (Whatman Inc., Clifton, N.J., USA).

Example 2

This example illustrates the preparation of a photo-definable mixture of polyimide and Nafion®.

Under yellow light, 2.0 g of Nafion® in γ-Valerolactone from Example 1 were added drop-wise to 5.0 g of a photo-definable polyimide solution, HD8821 (HD MicroSystems, LLC, Parlin, N.J., USA) under vigorous stirring. The stirring was continued for 18 h under yellow light.

Example 3

This example illustrates the preparation of substrates before coating with photo-definable polymer.

VM-651 adhesion promoter (HD MicroSystems, LLC, Parlin, N.J., USA) was diluted by adding 10 µL of VM-651 to 10 mL of DI water and filtering the mixture through 0.22 µm Millipore Millex-GP filter. Glass substrates (30×30 mm) with patterned ITO electrodes were cleaned in oxygen plasma using a March PX-500 (March Instruments Incorporated, Concord Calif.). with 720 mTorr oxygen pressure, 400 W for 300 s. and then flooded with the diluted VM-651 solution and allowed to stand for 20 seconds. The substrates were then dried by spinning at 2500 RPM for 30 seconds followed by a hotplate bake at 110° C. for 1 minute.

Example 4

This example illustrates the coating and photo-patterning of thin films of the material from Example 2.

Substrates freshly treated with adhesion promoter as described in Example 3 were coated with the Nafion®-HD8821 mixture from Example 2 by spin coating at 650 RPM for 60 seconds and then baked on a hotplate at 110° C. for 3 minutes in air. The final thickness of the film was measured to be 2.47 µm using a profilometer. Using a Suss MA150C Production Mask Aligner (SUSS MicroTec Lithography GmbH, Garching, Germany) the coated substrates were exposed through a pixelated photomask for 8 seconds with i-Line light source yielding an exposure dose of 9 mW. The substrates were subsequently developed using a mixture of 75% AZ 917 MIF Developer (AZ Electronic Materials USA Corp., Somerville, N.J., USA) and 25% water for approximately 60 seconds, followed by rinsing in DI water and drying in a stream of dry nitrogen.

Example 5

This example illustrates the preparation of water-free dispersion of Nafion® in γ-Valerolactone with sodium counter-ions.

Strong acid Dowex™ Monosphere™ M-31 (H$^+$) ion exchange resin (Dow Chemical Company, Midland, Mich., USA, 15 L) was soaked in DI water (12 L) for 18 hours. Water was removed by vacuum filtration. Iso-propyl alcohol (12 L) was added to the resin, allowed to sit for 60 minutes then removed by vacuum filtration. Water (12 L) was added to the resin, allowed to sit for 20 minutes and followed by removal. This water rinse step was repeated two more times.

An aqueous solution of 10% NaOH (12 L) was added to the resin, allowed to sit for 60 min and followed by vacuum filtration removal. The treatment with 10% NaOH (12 L) was repeated one more time. The resin was then washed with DI water until eluent was pH neutral. Finally, the sodium exchanged Dowex M-31 resin was allowed to air-dry for one week with occasional stirring.

Freeze-dried Nafion® (1.35 g) was re-dispersed in methanol (J. T. Baker, Avantor Performance Materials, Inc., Center Valley, Pa., USA, 33.7 g) forming a clear dispersion. The dispersion was run through a pad (15.0 g) of the sodium exchanged Dowex™ M-31 resin. To the eluent, 3.0 g of γ-Valerolactone were added and the methanol was removed by rotary evaporation. The final dispersion was filtered through 0.45 µm DP syringe filter (Whatman Inc., Clifton, N.J., USA). The w/w Nafion® solid content of the dispersion was determined to be 23.1% by evaporation.

Example 6

This example illustrates the preparation of a photo-definable mixture of polyimide and sodium exchanged Nafion®.

Under yellow light, 1.0 g of sodium exchanged Nafion© dispersion in γ-Valerolactone from Example 5, was added drop-wise to 5.0 g of photo-definable polyimide solution HD8821 under vigorous stirring. The stirring was continued for 18 h under yellow light.

Example 7

This example illustrates the coating and photo-patterning of thin films of the material from Example 6.

Substrates freshly treated with adhesion promoter as described in Example 3 were coated with the Nafion®-HD8821 mixture from Example 6 by spin coating at 875 RPM for 60 seconds and then baked on a hotplate at 110° C. for 3 minutes in air. The final thickness of the film was measured to be 2.59 µm using a profilometer.

Using a Suss MA150C Production Mask Aligner (SUSS MicroTec Lithography GmbH, Garching, Germany) the coated substrates were exposed through a pixelated photomask for 8 seconds with i-Line light source yielding an exposure dose of 9 mW. The substrates were subsequently developed using a mixture of 75% AZ 917 MIF Developer (AZ Electronic Materials USA Corp., Somerville, N.J., USA) and 25% water for approximately 75 seconds, followed by rinsing in DI water and drying in a stream of dry nitrogen.

Example 8

This example illustrates the preparation of water-free dispersion of Nafion® in γ-Valerolactone with ammonium counter-ions.

Dowex™ Monosphere™ M-31 (H$^+$) ion exchange resin was cleaned according to the procedure described in Example 5.

An aqueous solution of 9% ammonium chloride (1.25 L) was run through a column of 150 g of cleaned Dowex™ M-31 resin, followed by copious amounts of DI water. The resin was allowed to air-dry for one week with occasional stirring.

Freeze-dried Nafion® (1.35 g) was re-dispersed in methanol (J. T. Baker, Avantor Performance Materials, Inc., Center Valley, Pa., USA, 33.7 g) forming a clear dispersion. The dispersion was run through a pad (15.0 g) of the ammonium exchanged Dowex™ M-31 resin. To the eluent, 3.0 g of γ-Valerolactone were added and the methanol was removed by rotary evaporation. The final dispersion was filtered through 0.45 µm DP syringe filter (Whatman Inc., Clifton, N.J., USA). The w/w Nafion® solid content of the dispersion was determined to be 21.1% by evaporation.

Example 9

This example illustrates the preparation of a photo-definable mixture of polyimide and ammonium exchanged Nafion®.

Under yellow light, 1.0 g of ammonium exchanged Nafion© dispersion in γ-Valerolactone from Example 8, was added drop-wise to 5.0 g of photo-definable polyimide solution HD8821 under vigorous stirring. The stirring was continued for 18 h under yellow light.

Example 10

This example illustrates the coating and photo-patterning of thin films of the material from Example 9.

Substrates freshly treated with adhesion promoter as described in Example 3 were coated with the Nafion®-HD8821 mixture from Example 9 by spin coating at 750 RPM for 60 seconds and then baked on a hotplate at 110° C. for 3 minutes in air. The final thickness of the film was measured to be 2.53 µm using a profilometer.

Using a Suss MA150C Production Mask Aligner (SUSS MicroTec Lithography GmbH, Garching, Germany) the coated substrates were exposed through a pixelated photomask for 8 seconds with i-Line light source yielding an exposure dose of 9 mW. The substrates were subsequently developed using a mixture of 75% AZ 917 MIF Developer (AZ Electronic Materials USA Corp., Somerville, N.J., USA) and 25% water for approximately 60 seconds, followed by rinsing in DI water and drying in a stream of dry nitrogen.

What is claimed is:

1. A water-free liquid composition comprising:
    a photopolymer material;
    a fluorinated polymer, wherein the fluorinated polymer is selected from: fluorinated acid polymers, or fluorinated acid-salt polymers, or combinations thereof, and wherein the fluorinated acid polymer is a rapidly dried fluorinated acid polymer; and
    an organic liquid; wherein the weight amount of the photopolymer material is greater than 40% of the combined weight of the photopolymer material and the fluorinated polymer in the composition.

2. The liquid composition of claim 1 wherein the organic liquid is selected from: alcohols, or ethers, or ketones, or lactones, or alcohol-ethers, or acetates, or aldehydes, or esters, or amides, or combinations thereof.

3. The liquid composition of claim 1 wherein the rapid drying process is a freeze drying process.

* * * * *